(12) United States Patent
Augustyniak et al.

(10) Patent No.: US 7,812,646 B2
(45) Date of Patent: Oct. 12, 2010

(54) LOW-LEAKAGE SWITCH FOR SAMPLE AND HOLD

(75) Inventors: Marcin K. Augustyniak, Regensburg (DE); Bernhard Wicht, Munich (DE); Ingo Hehemann, Hagen a.T.W. (DE)

(73) Assignee: Texas Instruments Deutschland GmbH, Freising (DE)

( * ) Notice: Subject to any disclaimer, the term of this patent is extended or adjusted under 35 U.S.C. 154(b) by 52 days.

(21) Appl. No.: 12/249,509

(22) Filed: Oct. 10, 2008

(65) Prior Publication Data

US 2009/0153198 A1     Jun. 18, 2009

Related U.S. Application Data

(60) Provisional application No. 61/017,009, filed on Dec. 27, 2007.

(30) Foreign Application Priority Data

Oct. 10, 2007     (DE) .................. 10 2007 048 453

(51) Int. Cl.
    *G11C 27/02*     (2006.01)
(52) U.S. Cl. ....................................... 327/91
(58) Field of Classification Search .......... 327/91, 327/94, 95, 96
    See application file for complete search history.

(56) References Cited

U.S. PATENT DOCUMENTS

| 5,422,583 A * | 6/1995 | Blake et al. ............... 327/94 |
| 6,265,911 B1 | 7/2001 | Nairn |
| 6,504,406 B1 * | 1/2003 | Kakitani ................. 327/94 |
| 6,577,168 B1 * | 6/2003 | Kakitani ................. 327/94 |
| 7,532,042 B2 * | 5/2009 | Lee ....................... 327/91 |

\* cited by examiner

*Primary Examiner*—Jeffrey S Zweizig
(74) *Attorney, Agent, or Firm*—John J. Patti; Wade J. Brady, III; Frederick J. Telecky, Jr.

(57) ABSTRACT

An integrated electronic device includes a sample and hold stage. The sample and hold stage has a sampling capacitor (C) for an input voltage at an input node (Vin), a first switch (S1) coupled between the input node (Vin) and the sampling capacitor (C) for connecting the input node (Vin) to the sampling capacitor (C). There is also a voltage follower with an input coupled to the sampling capacitor (C). The first switch (S1) includes a first MOS transistor (NM1) coupled between the input node (Vin) and the sampling capacitor (C). The first MOS transistor has a bulk. The sample and hold stage is adapted to selectively couple the bulk to a node having a voltage level (V3) which is equal or close to the voltage level at the input node of the voltage follower.

14 Claims, 2 Drawing Sheets

LOW-LEAKAGE SWITCH FOR SAMPLE AND HOLD

CROSS-REFERENCE TO RELATED APPLICATIONS

This application claims the benefit of application Ser. No. 61/017,009 filed Dec. 27, 2007, which is incorporated herein by reference in its entirety.

BACKGROUND OF THE INVENTION

The present invention relates to a sample and hold circuit having reduced offset. More specifically the present invention relates to a sample and hold stage with a low leakage switch.

Sample and hold stages are used in a wide variety of circuitry and applications. A sample and hold stage typically includes a sampling capacitor and a plurality of switches. An input switch connects one side of the sampling capacitor to an input voltage. After this sampling phase the input switch opens and the charge on the sampling capacitor is frozen. The voltage level on the sampling capacitor is maintained during the hold phase while the input switch is open. Typically, an amplifier, e.g. configured as a voltage follower, is coupled to the sampling capacitor for buffering the sampled voltage level on the capacitor.

However, if the input switch is implemented as a MOS transistor, opening of the transistor has the undesired effect that leakage currents from the transistor add charge on the sampling capacitor. This situation is illustrated in FIG. 1. The operational amplifier AMP is configured as a non-inverting amplifier, with an amplification factor A. The input switch S1 consists of a single NMOS transistor NM1. Transistor NM1 is coupled between the input node Vin and the sampling capacitor C, which is also coupled to the non-inverting (positive) input of the amplifier having a voltage level V1. The leakage current includes a first component Im relating to a subthreshold current of the MOS transistor NM1. A second component of the leakage current is the leakage current Id relating to the bulk-source diode of the MOS transistor NM1.

FIG. 2 shows a known principle to avoid the component Im of the leakage current due to the subthreshold current of the transistor NM1. A switch S5 is coupled between the input node Vin and the first switch S1. The intermediate input node V4 between the first switch S1 and switch S5 is also coupled to a switch S4. When the first switch S1 and the switch S5 open, i.e. during the hold phase, the switch S4 is closed. The intermediate input node V4 is then coupled to a node V3. Node V3 has substantially the same voltage level as V1. Since no voltage drop across S1 exists, the leakage current component Im is reduced to a small residue that is due to the input offset voltage of the amplifier AMP. The following Table 1 shows the positions of the switches S1, S5, S4 during the sample and during the hold phase:

TABLE 1

|  | S1 | S5 | S4 |
| --- | --- | --- | --- |
| Sample | C | C | O |
| Hold | O | O | C |

C stands for close and O stands for open, wherein close means that the switch provides a connection and open means that the switch disconnects.

The circuit shown in FIG. 2 only reduces the first component Im of the leakage current. The second component Id is unaffected. The conventional solution for reducing Id involves minimizing the ratio between the source area of NM1 and the sampling capacitor C to make it as small as possible. However, there are many constraints which contravene this approach, as for example the switching or settling speed of the circuit or the maximum allowable area consumed by the capacitor C.

SUMMARY OF THE INVENTION

It is a general object of the present invention to provide an electronic device including a sample and hold stage in which the second component Id of the leakage current is more reduced than in prior art solutions.

This and other objects and features are provided, in accordance with an aspect of the present invention by an integrated electronic device which includes a sample and hold stage. The sample and hold stage includes a sampling capacitor for sampling an input voltage at an input node and a first switch coupled between the input node and the sampling capacitor for connecting the input node to the sampling capacitor. A voltage follower has an input coupled to the sampling capacitor. The first switch includes a first MOS transistor coupled between the input node and the sampling capacitor. The first MOS transistor has a bulk and the sample and hold stage is further adapted to selectively couple the bulk to a node having a voltage level which is equal or close to the voltage level at the input node of the voltage follower (i.e. of the voltage on the sampling capacitor). According to the present invention, the bulk of a MOS transistor, which is used as a switch for a sample and hold stage, is controlled, such that the voltage drop between the bulk and the source or the drain of the MOS transistor is reduced. For a small voltage drop across the MOS transistor, only a very small leakage current is to be expected. However, adjusting the voltage level of a MOS transistor's bulk is only possible if the bulk is somehow disconnected or isolated from the substrate of the integrated electronic device. This can be done by providing an isolated well, in which the MOS transistor is placed, or by placing the transistor into a tank isolated by deep diffusion on the sides and a buried layer from the bottom. The present invention is particularly useful for fast sampling operations, where fast switching is required. Therefore, the MOS transistor can advantageously be an NMOS transistor having a extra isolated well, or a tank isolated by deep diffusion on the sides and a buried layer from the bottom.

The coupling of the bulk of the first transistor to the node having the required voltage level can be done by use of a second switch and a third switch coupled to the bulk of the first MOS transistor. The second and the third switches are controlled such that the bulk has a first voltage level during a hold phase and a to a second voltage level during a sample phase of the sample and hold stage. Preferably, the bulk of the first MOS transistor is controlled within the hold phase to have a voltage level that corresponds to the voltage level at the input of the voltage follower. If the voltage level of the bulk corresponds to the input of the voltage follower, the voltage drop across the first MOS transistor is minimized and the leakage current becomes almost zero.

According to an aspect of the invention, the voltage follower is an operational amplifier coupled to operate as a voltage follower. The operational amplifier has a positive input serving as the input of the voltage follower.

Advantageously, the integrated electronic circuit further comprises a fourth switch and a fifth switch. The fifth switch is coupled between the input node and an input of the first switch, thereby providing an intermediate input node between the first switch and the fifth switch. Practically, the intermediate node is an additional node established between the first and the fifth switch by coupling the fifth switch to the input node. The fourth switch is arranged such that the fourth switch connects a node with the intermediate input node in a closed state, the node having a voltage level that corresponds to the voltage level at a negative input node of the operational amplifier. The voltage of the negative input node of the operational amplifier is substantially equal to the voltage of the positive input node of the operational amplifier, if the operational amplifier is configured as a voltage follower. Therefore, the node coupled to the negative input node can preferably be used to define the voltage level on the intermediate node. This arrangement provides that the voltage drop across drain and source of the first MOS transistor is minimized during the hold phase. Using a fourth and a fifth switch in combination with the present invention allows almost all kinds of leakage currents to be avoided.

Further, a control stage can be provided in the integrated electronic device according to the present invention, which is adapted to control the switching of the second switch in a specific way. According to this aspect of the present invention, the second switch is coupled to the negative input of the operational amplifier. In this situation, the second switch is controlled by the control stage such that it is only closed when the operational amplifier (or the voltage follower if another kind of voltage follower is used) has completely settled. Otherwise there would be a risk that glitches or changes in the voltage level at the negative input could interfere with the required voltage level of the bulk of the first MOS transistor. Therefore, it is necessary to close the second switch only after a time the operational amplifier needs to settle. Since the operational amplifier is connected as a voltage follower, the voltage level at the negative input node will be almost similar to the voltage level at the positive input node after the required settling time. Therefore, the voltage level at the bulk becomes almost equal to the voltage level at the drain or the source (dependent on which of the source or the drain is connected to the positive input node of the operational amplifier) of the first MOS transistor. Further, there can be a comparator with a built-in offset for detecting a minimum voltage difference between the positive input and the negative input of the operational amplifier. Such a comparator can be adapted to monitor the correct and complete settling of the operational amplifier. Only if the input voltages at the positive and negative input node of the operational amplifier are within a specific range, the second switch might be closed. A low pass filter can be coupled to the bulk of the first MOS transistor for smoothing the voltage level at the bulk. This is another possibility for minimizing glitches or unwanted variations of the voltage level of the bulk of the first transistor.

An aspect of the present invention also provides a method for sampling a voltage with a sample and hold stage. A first MOS transistor is closed in order to couple a sampling capacitor to an input voltage to be sampled. The first MOS transistor is then opened for holding the sampled voltage on the sampling capacitor. The voltage level at the bulk of the first MOS transistor is controlled while the first MOS transistor is open, such that the voltage level of the bulk is equal or close to the sampled voltage level on the sampling capacitor. Accordingly, the voltage drop across the first MOS transistor, in particular between bulk and the side which is coupled to the sampling capacitor is minimized and leakage current is avoided. The step of controlling the voltage level at the bulk, in particular coupling the bulk to a node with a required voltage level corresponding to the input voltage level at the voltage follower's input can be delayed for a specific settling time the voltage follower (or the operational amplifier) needs to settle.

BRIEF DESCRIPTION OF THE DRAWING

Further details of the present invention will ensue from the description hereinbelow of the preferred embodiment with reference to the accompanying drawings, in which.

DETAILED DESCRIPTION OF THE INVENTION

Figure 1:
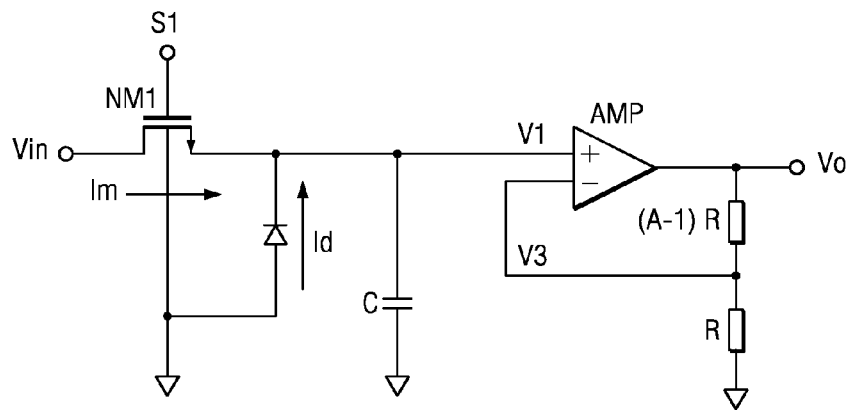
FIG. 1 shows a simplified circuit diagram of a sample and hold stage according to the prior art.
Figure 2:
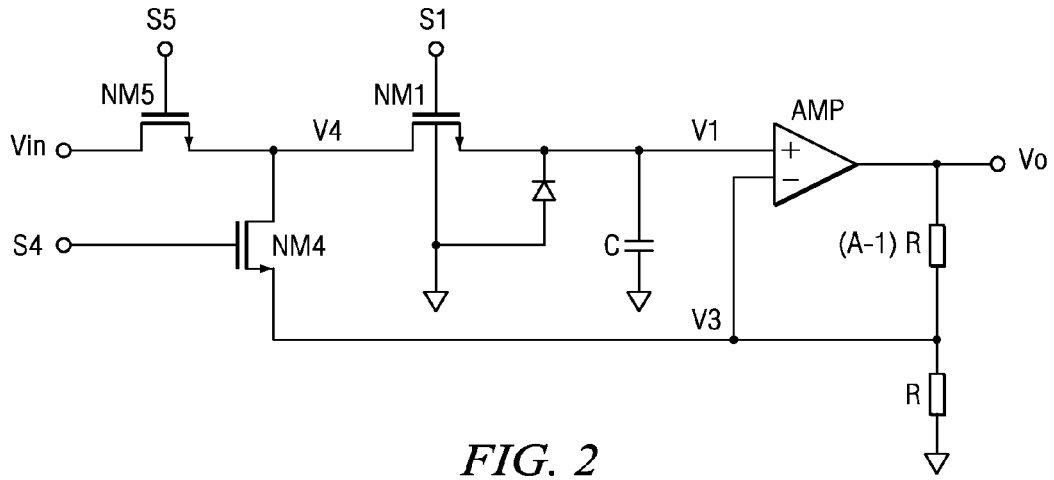
FIG. 2 shows a simplified circuit diagram of a sample and hold stage according to the prior art.
Figure 3:
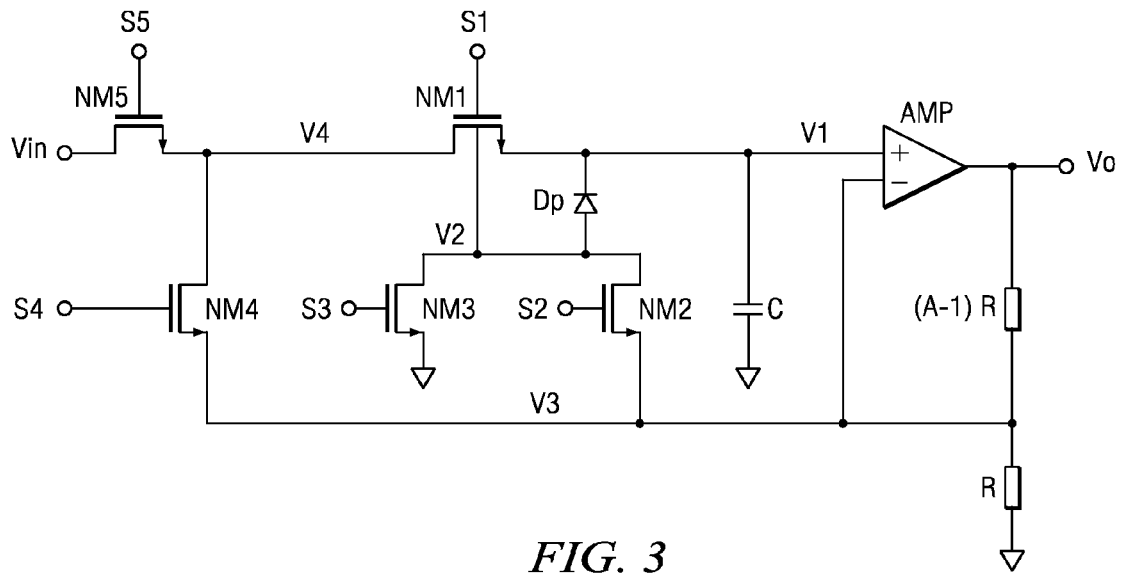
FIG. 3 shows a simplified circuit diagram of a first embodiment of the present invention.

FIG. 3 shows a simplified circuit diagram of a first embodiment of the present invention. There is a sample and hold stage comprising a first switch S1 which includes a MOS transistor NM1. The MOS transistor has a bulk connection V2 and a parasitic diode DP is connected between the bulk and the source terminal of the first transistor NM1. The positive input node of the operational amplifier AMP is coupled to the sampling capacitor C. The sampled voltage level on the input node of the operational amplifier is V1. The operational amplifier AMP is connected as a voltage follower having an amplification factor A by use of resistors (A−1)R and resistor R. The bulk of the first transistor NM1 is coupled through a second switch S2 to the negative input node V3 of the operational amplifier. A third switch S3 is implemented by a single NMOS transistor NM3 and is adapted to couple the bulk V2 of the first MOS transistor NM1 to ground. Further, there is a fourth switch S4 implemented by an NMOS transistor NM4 for transferring the voltage level V3 at the negative input node of the operational amplifier to the intermediate node V4. Intermediate node V4 is located between a fifth switch S5 consisting of an NMOS transistor NM5 and the first MOS transistor NM1, e.g. the first switch S1. The following Table 2 indicates the setting of the switches during sampling and hold phase.

TABLE 2

|  | S1 | S5 | S4 | S2 | S3 |
|---|---|---|---|---|---|
| Sample | C | C | O | O | C |
| Hold | O | O | C | C | O |

As indicated in Table 2, switches S5 and S1 close in order to sample the input voltage Vin on the sampling capacitor C. During this sampling phase, the switches S2 and S4 are open and switch S3 is closed. During the hold phase, the switches S1 and S5, as well as the switch S3, open, whereas switches S2 and S4 close. This provides that the voltage level V2 at the bulk of the first MOS transistor NM1 is coupled to the node V3 so as to transfer the voltage level of the negative input node V3 of the operational amplifier AMP to the bulk V2 of the NMOS transistor NM1 (switch S1). During the hold phase, the switches S1 and S5 open and the intermediate input node V4 is coupled to the negative input node (voltage level V3) of the operational amplifier AMP. Accordingly, the voltage level at node V4 becomes almost equal to the voltage level at V3. Since the voltage levels at V2 and V4 are almost equal to the voltage level at V1, almost no voltage drop across the transistor NM1 exists and leakage currents are avoided.

Figure 4:
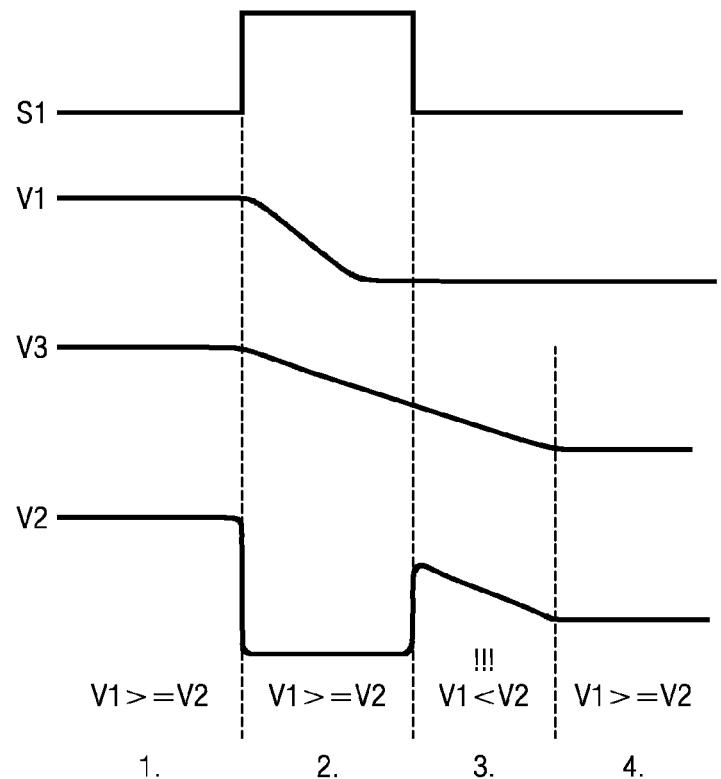
FIG. 4 shows waveforms relating to signals of the first embodiment of the present invention.

FIG. 4 shows waveforms relating to the circuit diagram shown in FIG. 3. Accordingly, the switch S1 closes for a certain time in order to sample the input voltage. While the input voltage is being sampled, the voltage level at V1, i.e. the positive input node of the operational amplifier AMP, drops in accordance with the sampled input voltage. The voltage level V3 at the negative input node of the operational amplifier AMP follows with a certain delay in accordance with the settling behavior of the operational amplifier AMP. However, the voltage at V2 should finally settle to a voltage level corresponding to V1. Since the switch S2 is closed during the hold phase, a voltage peak occurs at the bulk V2 of the first transistor NM1 during phase 3. Only when the voltage V3 has sufficiently settled in phase 4, switch S4 should be closed. Accordingly, if the settling time is longer than the sampling time, and for negative transitions of the voltage level at V1, there might be a time slot, in which V2 is greater than V1. In this situation, the parasitic diode DP can be forward biased. The resulting diode current can then charge the capacitor C and may introduce a significant error of the complete sample and hold procedure. Another risk relates to glitches of the bottom plate of the sampling capacitor C. During the hold phase and due to temporary glitches (for example of the supply voltage of the operational amplifier AMP), the output voltage V0 of the operational amplifier AMP and also the voltage level V3 at the negative input node of the operational amplifier AMP may have glitches. A glitch in a positive direction may also temporarily forward-bias the parasitic diode DP and charge the capacitor C. These problems can be solved by the circuit shown in FIG. 5.

Figure 5:
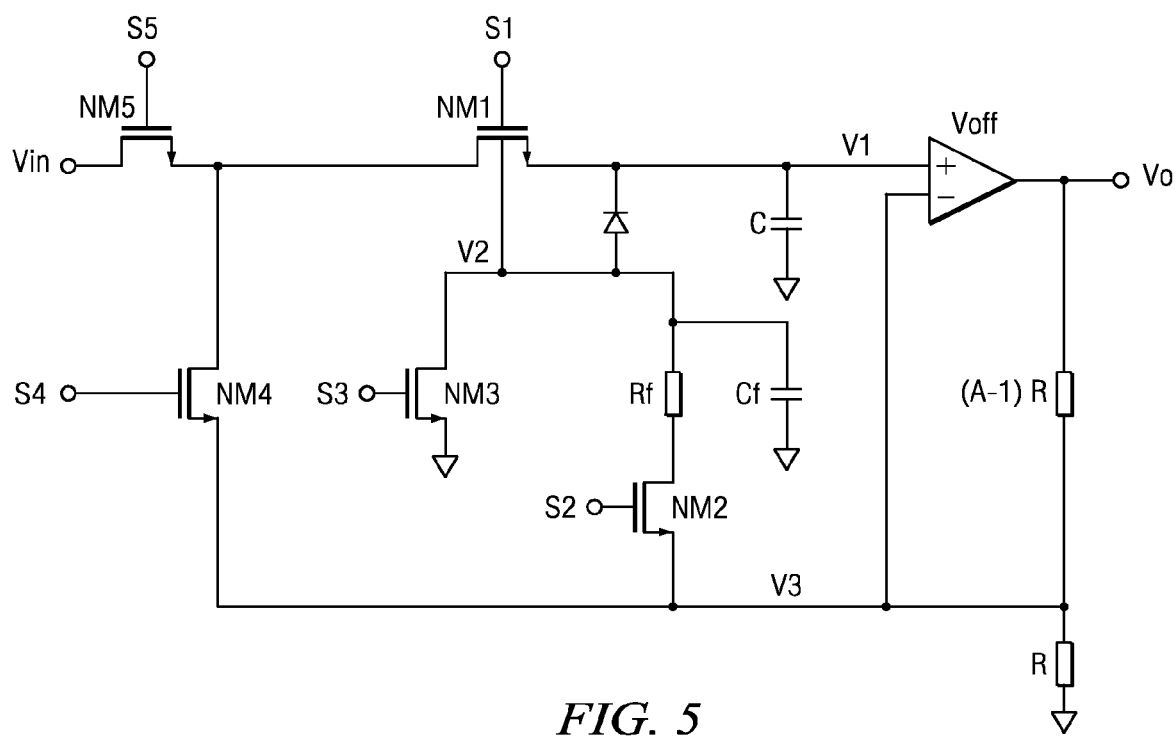
FIG. 5 shows a simplified circuit diagram of a second embodiment of the present invention.

FIG. 5 shows a simplified circuit diagram of a second embodiment of the present invention. The components and nodes are similar to those shown in FIG. 4. However, there is an additional resistor RF and a capacitor CF coupled between the second switch S2 (transistor NM2) and the bulk V2 of the first transistor NM1. This resistive-capacitive arrangement acts as an RC filter that filters the voltage level at V3, at the negative input of the operational amplifier AMP, with respect to ground. Therefore, it is important that the bottom plate of the capacitor CF is connected to exactly the same ground as the sampling capacitor C. Accordingly, any peaks or glitches in the voltage level at V3 are reduced by the RC filter consisting of the resistor RF and the capacitor CF. Further, the switches can be controlled in a specific way in order to avoid problems due to the settling time of the operational amplifier AMP. For example, the switch S2 can be closed only after a specific delay, i.e. when the settling of the operational amplifier AMP is completed. The switch S2 can also be opened only a specific waiting period after the first switch S1 has been closed. In order to make sure that the settling of the operational amplifier AMP is sufficient, a comparator can be coupled between the positive and negative input node of the operational amplifier AMP. Accordingly, the voltage levels at V1 and V3 are compared. If a comparator is used with a built-in offset, the comparator can issue a control signal which triggers switch S2 to close when the voltage level at V3 has approached that at V1 within a specific range, e.g. 30 mV. In other words, the comparator with the built-in offset detects the minimum voltage difference between the positive input and the negative input of the operational amplifier AMP and only triggers the switch S2 to close when the input voltages at the positive and negative input nodes are within this specific range.

Although the present invention has been described with reference to a specific embodiment, it is not limited to this embodiment and no doubt alternatives will occur to the skilled person that lie within the scope of the invention as claimed.

The invention claimed is

1. An apparatus comprising:
a sampling capacitor for an input voltage at an input node;
a first switch coupled between the input node and the sampling capacitor for connecting the input node to the sampling capacitor;
a voltage follower an input coupled to the sampling capacitor, the first switch including a first MOS transistor coupled between the input node and the sampling capacitor, wherein the first MOS transistor has a bulk and the apparatus is adapted to selectively couple the bulk to a node having a voltage level which is equal or close to the voltage level at the input node of the voltage follower; and
a second switch and a third switch coupled to the bulk of the first MOS transistor, so as to control the voltage level of the bulk to have first voltage level during a hold phase and a to a second voltage level during a sample phase of the sample and hold stage.

2. The apparatus of claim 1, wherein the voltage follower is an operational amplifier coupled to operate as a voltage follower with a positive input of the operational amplifier serving as the input of the voltage follower, the integrated electronic circuit further comprising a fourth switch and a fifth switch, the fifth switch being coupled between the input node and an input of the first switch thereby providing an intermediate input node between the first switch and the fifth switch, wherein the fourth switch is arranged such that the fourth switch connects a node with the intermediate input node in a closed state, the node having a voltage level that corresponds to the voltage level at a negative input node of the operational amplifier.

3. The apparatus of claim 1, further comprising a control stage which is adapted to control the switching of the second switch such that second switch is only closed when the voltage follower has settled.

4. The apparatus of claim 3, further comprising a comparator with a built-in offset for detecting a minimum voltage difference between the positive input and the negative input of the operational amplifier.

5. The apparatus of claim 1, further comprising a low pass filter coupled to the bulk of the first MOS transistor for smoothing the voltage level at the bulk.

6. An apparatus comprising:
a sampling capacitor for an input voltage at an input node;
a first switch coupled between the input node and the sampling capacitor for connecting the input node to the sampling capacitor;
a voltage follower an input coupled to the sampling capacitor, the first switch including a first MOS transistor coupled between the input node and the sampling capacitor, wherein the first MOS transistor has a bulk and the apparatus is adapted to selectively couple the bulk to a node having a voltage level which is equal or close to the voltage level at the input node of the voltage follower, and wherein the voltage follower includes an operational amplifier coupled to operate as a voltage follower with a positive input of the operational amplifier serving as the input of the voltage follower;
a fourth switch; and
a fifth switch, wherein the fifth switch is coupled between the input node and an input of the first switch thereby providing an intermediate input node between the first switch and the fifth switch, and wherein the fourth switch is arranged such that the fourth switch connects a node with the intermediate input node in a closed state, and wherein the node having a voltage level that corresponds to the voltage level at a negative input node of the operational amplifier.

7. The apparatus of claim 6, further comprising a control stage which is adapted to control the switching of the second switch such that second switch is only closed when the voltage follower has settled.

8. The apparatus of claim 6, further comprising a comparator with a built-in offset for detecting a minimum voltage difference between the positive input and the negative input of the operational amplifier.

9. The apparatus of claim 6, further comprising a low pass filter coupled to the bulk of the first MOS transistor for smoothing the voltage level at the bulk.

10. An apparatus comprising:
a sampling capacitor for an input voltage at an input node;
a first switch coupled between the input node and the sampling capacitor for connecting the input node to the sampling capacitor;
a voltage follower an input coupled to the sampling capacitor, the first switch-including a first MOS transistor coupled between the input node and the sampling capacitor, wherein the first MOS transistor has a bulk and the apparatus is adapted to selectively couple the bulk to a node having a voltage level which is equal or close to the voltage level at the input node of the voltage follower; and
a low pass filter coupled to the bulk of the first MOS transistor for smoothing the voltage level at the bulk.

11. An apparatus comprising:
a first switch that receives an input signal;
a MOS transistor that is coupled to the first switch at its drain;
a second switch that is coupled to the bulk of the MOS transistor;
a sampling capacitor that is coupled to the source of the MOS transistor;
an amplifier having a first input terminal, a second input terminal, and an output terminal, wherein the first input terminal of the amplifier is coupled to the sampling capacitor and wherein the second input terminal of the amplifier is coupled to the second switch.

12. The apparatus of claim 11, wherein the apparatus further comprises a voltage divider that is coupled to the output terminal of the amplifier and the second input terminal of the amplifier.

13. The apparatus of claim 12, wherein the apparatus further comprises a third switch that is coupled to the bulk of the MOS transistor.

14. The apparatus of claim 13, wherein the apparatus further comprises a low pass filter that is coupled between the bulk of the MOS transistor and the second switch.

* * * * *